US012740491B2

(12) United States Patent
Chang

(10) Patent No.: US 12,740,491 B2
(45) Date of Patent: Sep. 15, 2026

(54) SEMICONDUCTOR PACKAGE

(71) Applicant: Samsung Electronics Co., Ltd., Suwon-si (KR)

(72) Inventor: Gunho Chang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 347 days.

(21) Appl. No.: 18/608,030

(22) Filed: Mar. 18, 2024

(65) Prior Publication Data

US 2025/0118709 A1 Apr. 10, 2025

(30) Foreign Application Priority Data

Oct. 10, 2023 (KR) ........................ 10-2023-0134422

(51) Int. Cl.

*H10W 90/28* (2026.01)
*H10B 80/00* (2026.01)
*H10W 74/10* (2026.01)
*H10W 90/20* (2026.01)
*H10W 90/00* (2026.01)

(52) U.S. Cl.

CPC ............ *H10W 90/28* (2026.01); *H10B 80/00* (2023.02); *H10W 74/111* (2026.01); *H10W 90/297* (2026.01); *H10W 90/722* (2026.01)

(58) Field of Classification Search

CPC . H10W 90/28; H10W 90/297; H10W 90/722; H10W 20/20; H10W 74/111–117; H10B 80/00

See application file for complete search history.

(56) References Cited

U.S. PATENT DOCUMENTS

| | | | | |
|---|---|---|---|---|
| 8,629,553 | B2 | 1/2014 | Farooq et al. | |
| 9,640,521 | B2 | 5/2017 | Chang et al. | |
| 9,853,012 | B2 | 12/2017 | Chung et al. | |
| 10,908,212 | B2 | 2/2021 | Lee et al. | |
| 11,233,035 | B2 * | 1/2022 | Chen | H10W 90/00 |
| 2013/0153898 | A1 * | 6/2013 | Takahashi | H10P 74/273 257/48 |
| 2015/0214191 | A1 * | 7/2015 | Lee | H10W 74/014 257/777 |
| 2018/0006006 | A1 * | 1/2018 | Kim | H10W 90/00 |
| 2020/0381397 | A1 * | 12/2020 | Yu | H10W 74/121 |
| 2020/0402958 | A1 * | 12/2020 | Fang | H10W 74/014 |

(Continued)

*Primary Examiner* — Lauren R Bell

(74) *Attorney, Agent, or Firm* — Harness, Dickey & Pierce, P.L.C.

(57) ABSTRACT

A semiconductor package may include a chip stack, a first semiconductor chip provided on a top surface of the chip stack, outer terminals provided on a bottom surface of the chip stack, and a mold layer provided on a bottom surface of the first semiconductor chip to enclose the chip stack. The chip stack may include a second semiconductor chip including first penetration vias, which are provided in second semiconductor chip and are exposed to an outside of the second semiconductor chip. The chip stack may include third semiconductor chips stacked on a top surface of the second semiconductor chip. Each of the third semiconductor chips may include second penetration vias, which are provided to penetrate the same and are exposed to an outside of the same. The first semiconductor chip may have a width larger than the chip stack, and the first semiconductor chip may include a logic chip.

20 Claims, 10 Drawing Sheets

(56) References Cited

U.S. PATENT DOCUMENTS

| | | | | |
|---|---|---|---|---|
| 2022/0223565 | A1 | 7/2022 | Chen et al. | |
| 2022/0310556 | A1 | 9/2022 | Huang et al. | |
| 2022/0336393 | A1* | 10/2022 | Chen | H10W 74/016 |
| 2022/0336431 | A1 | 10/2022 | Yu et al. | |
| 2023/0005853 | A1* | 1/2023 | Park | H10P 74/273 |
| 2023/0067350 | A1 | 3/2023 | Yew et al. | |
| 2023/0113285 | A1 | 4/2023 | Hu et al. | |
| 2024/0038728 | A1* | 2/2024 | Jang | H10W 90/00 |
| 2024/0040805 | A1* | 2/2024 | Chung | H10B 80/00 |
| 2024/0055406 | A1* | 2/2024 | Kim | H10W 76/40 |
| 2024/0145317 | A1* | 5/2024 | Shin | H10P 74/273 |

* cited by examiner

FIG. 1

CST1
540
10
12
700
600
610
626
624
622
640
630
620

FIG. 6

CST1
800
600
CST2
20
22
10
12

100
200
300
110
112
120
122
250
260
224
210
212
220
222
324
320
310
1000

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2023-0134422, filed on Oct. 10, 2023, in the Korean Intellectual Property Office, the entire contents of which are hereby incorporated by reference.

BACKGROUND

The present disclosure relates to semiconductor packages, and in particular, to a stack-type semiconductor packages, in which a plurality of semiconductor chips are stacked, and methods of fabricating the same.

With the recent advance in the electronics industry, demand for high-performance, high-speed, and compact electronic components are increasing. To meet this demand, packaging technologies of mounting a plurality of semiconductor chips in a single package are being developed.

Recently, demand for portable electronic devices has been rapidly increasing in the market, and thus, it is necessary to reduce the sizes and weights of electronic components constituting the portable electronic devices. For this, it is necessary to develop packaging technologies of reducing the size and the weight of each component and of integrating a plurality of individual components in a single package. Here, a plurality of adhesive members are used to attach the components to each other, but the increase in the number of the adhesive members leads to various technical problems.

SUMMARY

Some example embodiments of the inventive concepts provide semiconductor packages with improved structural stability and/or methods of fabricating the same.

Some example embodiments of the inventive concepts provide methods for reducing the failure rate in fabricating a semiconductor package with a multiple stack structure and/or semiconductor packages fabricated thereby.

According to an example embodiment of the inventive concepts, a semiconductor package includes a chip stack, a first semiconductor chip on a top surface of the chip stack, outer terminals on a bottom surface of the chip stack, and a mold layer on a bottom surface of the first semiconductor chip and enclosing the chip stack, wherein the chip stack comprises a second semiconductor chip comprising first penetration vias, the first penetration vias penetrating the second semiconductor chip, the first penetration vias exposed to an outside of the second semiconductor chip from a bottom surface thereof, and third semiconductor chips stacked on a top surface of the second semiconductor chip, and wherein each of the third semiconductor chips comprises second penetration vias penetrating therethrough and exposed to an outside thereof from a bottom surface thereof, a width of the first semiconductor chip is larger than a width of the chip stack, and the first semiconductor chip comprises a logic chip.

According to an example embodiment of the inventive concepts, a semiconductor package includes first semiconductor chips vertically stacked on each other, a second semiconductor chip on a bottom surface of a lowermost one of the first semiconductor chips, a third semiconductor chip on a top surface of an uppermost one of the first semiconductor chips, and a mold layer on a bottom surface of the third semiconductor chip and enclosing the first semiconductor chips and the second semiconductor chip, wherein each of the first semiconductor chips comprises upper pads on top surfaces thereof, first connection terminals on top surfaces thereof, and lower pads on bottom surfaces thereof, wherein the second semiconductor chip comprises chip pads on a top surface of the second semiconductor chip, and second connection terminals on top surfaces of the chip pads, and wherein each of the first semiconductor chips is electrically connected to another of the first semiconductor chips or the third semiconductor chip through the first connection terminals, the second semiconductor chip is electrically connected to the lowermost one of the first semiconductor chips through the second connection terminals, each of the first and second connection terminals comprises a solder ball or a solder bump, a bottom surface of the second semiconductor chip is coplanar with a bottom surface of the mold layer, the third semiconductor chip comprises a logic chip, a width of the third semiconductor chip is larger than a width of each of the first semiconductor chips, and a thickness of the third semiconductor chip ranges from 100 μm to 200 μm.

According to an example embodiment of the inventive concepts, a semiconductor package includes a package substrate, a first chip structure on the package substrate, a first semiconductor chip on the package substrate and horizontally spaced apart from the first chip structure, and a first mold layer on the package substrate and enclosing the first chip structure and the first semiconductor chip, wherein the first chip structure comprises a second semiconductor chip, a plurality of third semiconductor chips vertically stacked on the package substrate and being between the package substrate and the second semiconductor chip, each of the third semiconductor chips comprising penetration vias penetrating therethrough and exposed to an outside from a bottom surface thereof, first pads on a bottom surface of a lowermost one of the third semiconductor chips and directly coupled to the penetration vias of the lowermost one of the third semiconductor chips, and a second mold layer between the package substrate and the second semiconductor chip to enclose the third semiconductor chips, and wherein the second semiconductor chip comprises a logic chip, a width of the second semiconductor chip is larger than a width of each of the third semiconductor chips, a side surface of the second semiconductor chip is vertically aligned to a side surface of the second mold layer, an active surface of the second semiconductor chip faces the package substrate, and an active surface of an uppermost one of the third semiconductor chips faces the second semiconductor chip.

BRIEF DESCRIPTION OF THE DRAWINGS

FIG. 1 is a sectional view illustrating a semiconductor package according to an example embodiment of the inventive concepts.

FIG. 6 is a sectional view illustrating a semiconductor package according to an example embodiment of the inventive concepts.

DETAILED DESCRIPTION

Example embodiments of the inventive concepts will now be described more fully with reference to the accompanying drawings, in which some example embodiments are shown.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the term "about," "substantially" or "approximately" is used in this specification in connection with a numerical value, it is intended that the associated numerical value includes a manufacturing or operational tolerance (e.g., ±10%) around the stated numerical value. Moreover, when the word "about," "substantially" or "approximately" is used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof. Likewise, A and/or B means A, B, or A and B.

Figure 1:
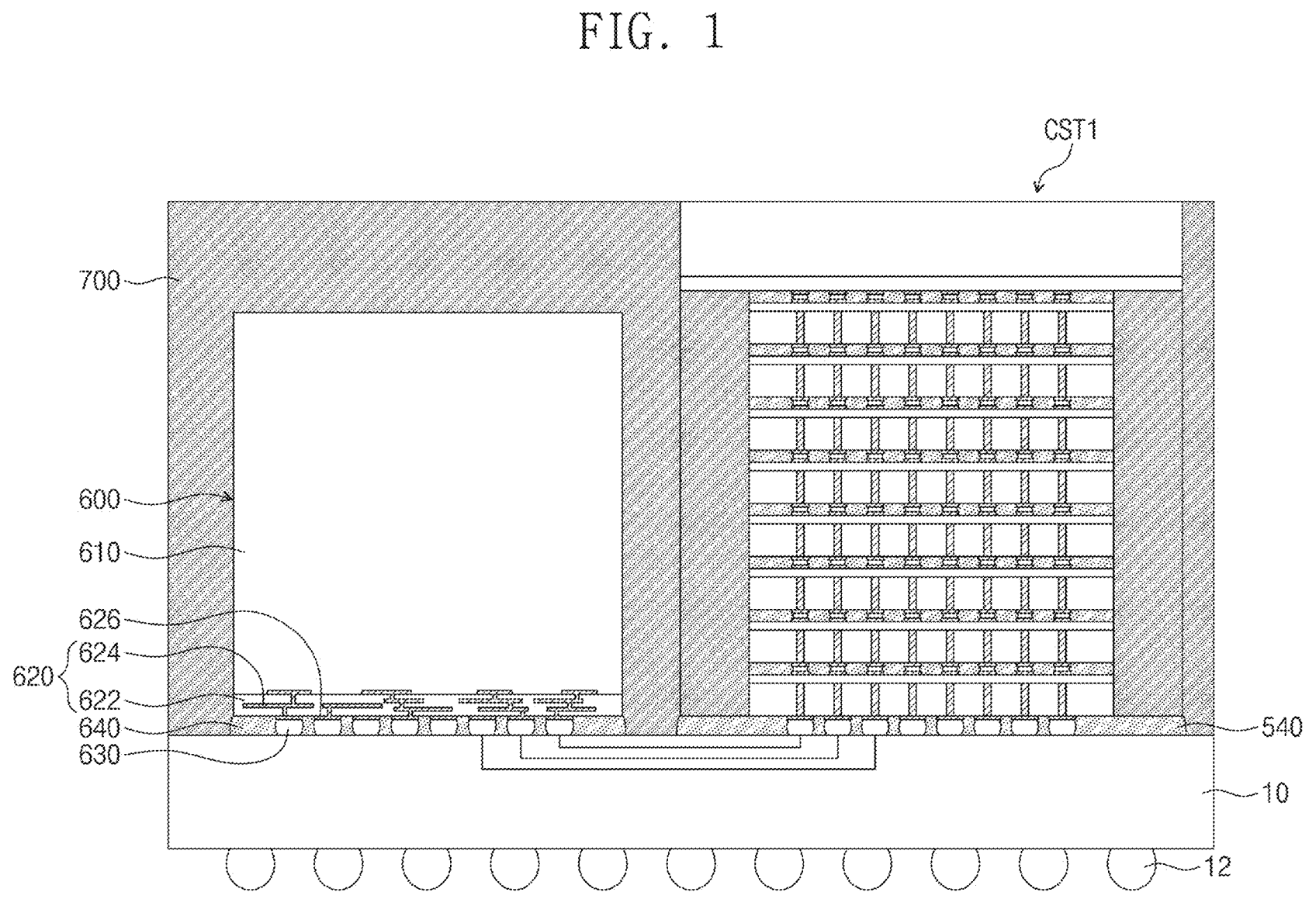
Figure 6:
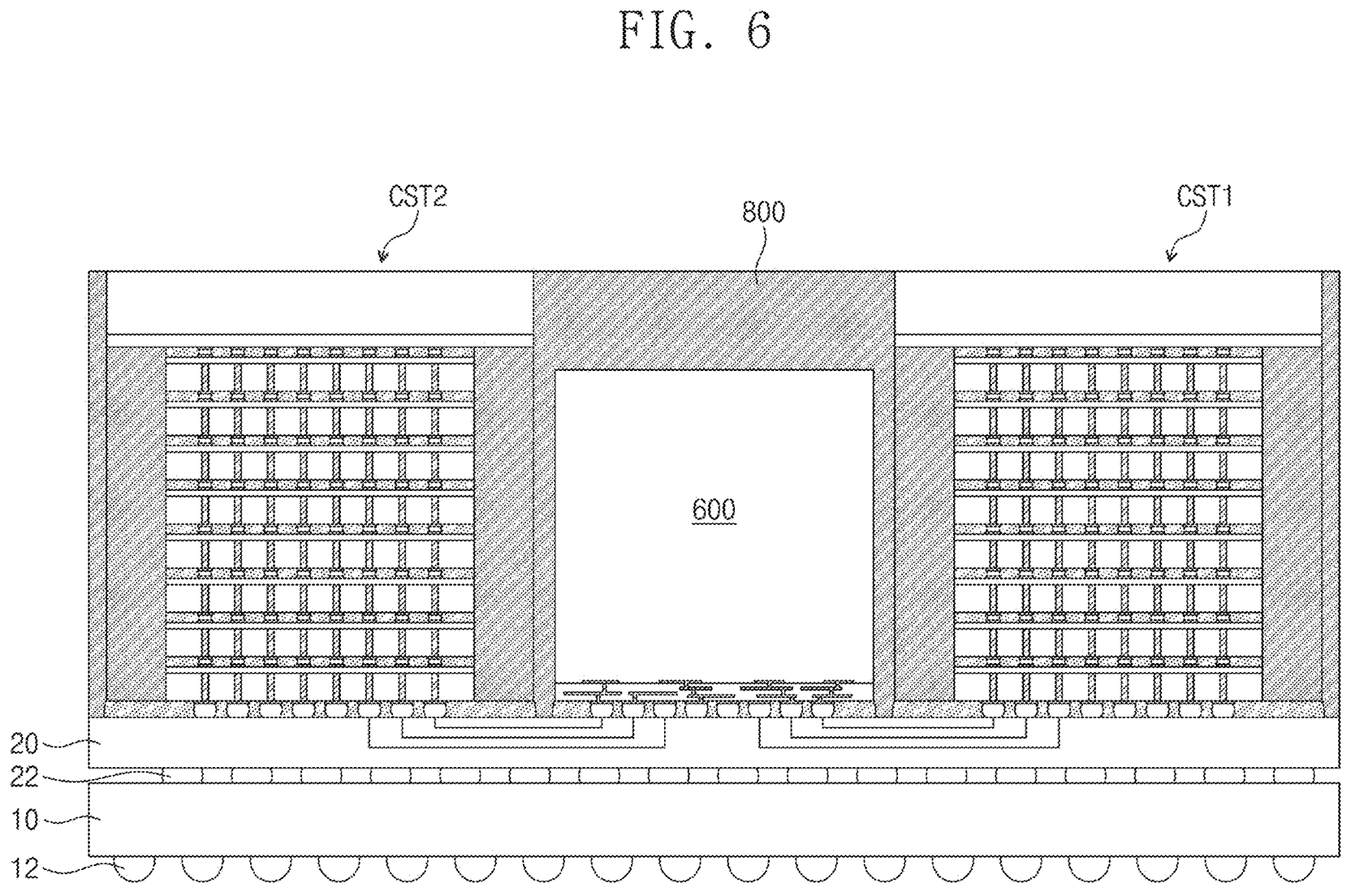

FIG. 1 is a sectional view illustrating a semiconductor package according to an example embodiment of the inventive concepts. FIGS. 2 to 5 are sectional views illustrating a first chip structure according to an example embodiment of the inventive concepts. FIG. 6 is a sectional view illustrating a semiconductor package according to an example embodiment of the inventive concepts.

Figure 2:
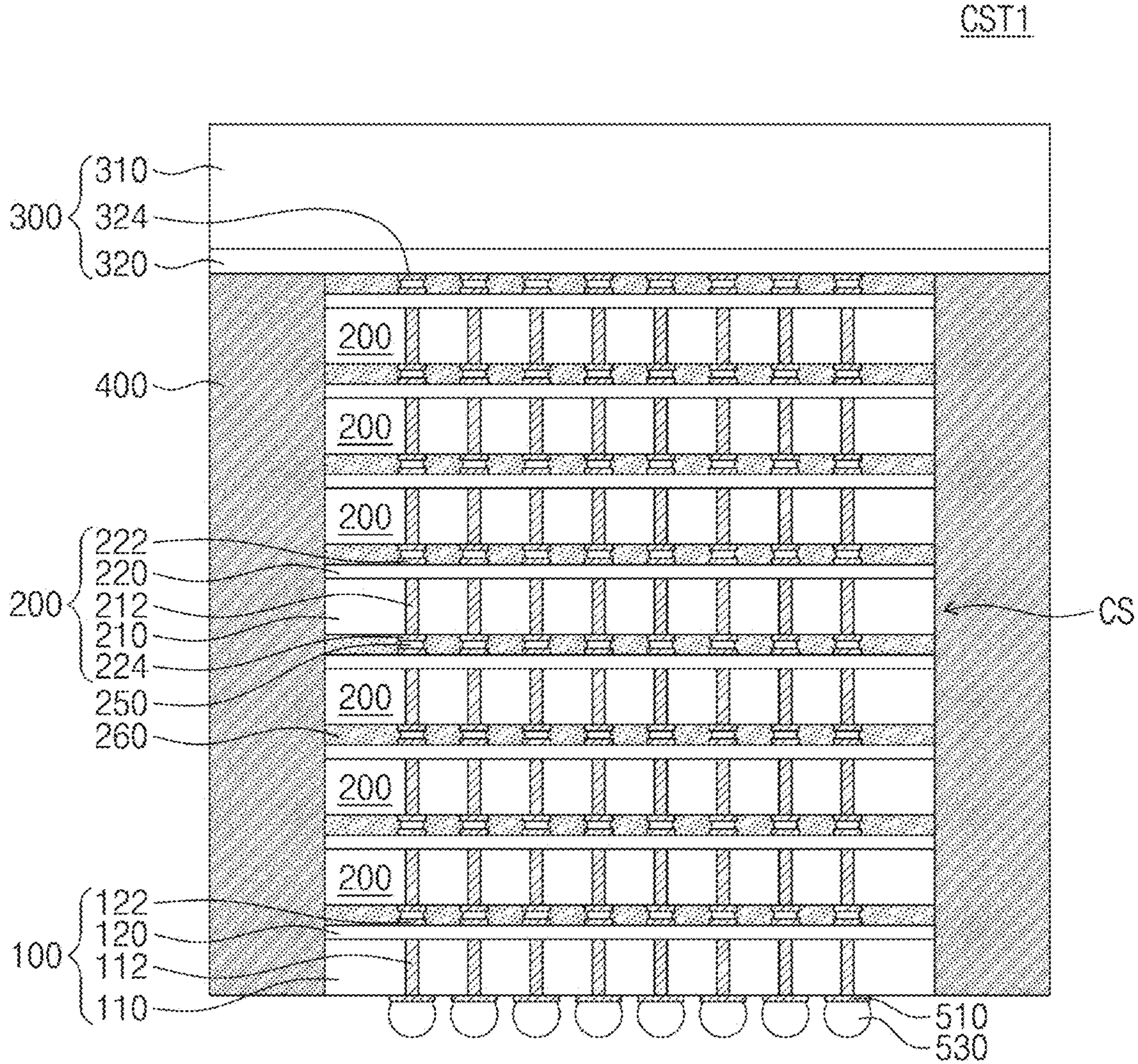
FIGS. 2 to 5 are sectional views illustrating a chip structure according to an example embodiment of the inventive concepts.

Referring to FIGS. 1 and 2, a substrate 10 may be provided. The substrate 10 may be used to redistribute devices (e.g., a first chip structure CST1 and a fourth semiconductor chip 600 to be described below), which are mounted on a top surface of the substrate 10. That is, the substrate 10 may be a redistribution substrate. Although not shown, one or more substrate interconnection layers, which are stacked on top of each other and includes an insulating pattern and an interconnection pattern in the insulating pattern, may be provided in the substrate 10. For example, the interconnection pattern in the insulating pattern may be extended and connected to the interconnection pattern of another substrate interconnection layer. Although not shown, outer pads, which are used for connection with outer terminals 12 to be described below, may be provided on a bottom surface of the substrate 10. In some example embodiments, the substrate 10 may be a printed circuit board (PCB). For example, the substrate 10 may include a core layer and peripheral portions, which are placed on or below the core layer and are used as an interconnection structure. Here, the substrate 10 may electrically connect devices, which are mounted thereon, to each other.

Outer terminals 12 may be provided on the bottom surface of the substrate 10. The outer terminals 12 may include solder balls or solder bumps. The semiconductor package may be classified into a ball grid array (BGA) package, a fine ball-grid array (FBGA) package, or a land grid array (LGA) package, depending on the kind and arrangement of the outer terminals 12. The outer terminals 12 may include a conductive metal material. For example, the outer terminals 12 may be formed of or include at least one of metallic materials (e.g., tin (Sn), lead (Pb), silver (Ag), zinc (Zn), nickel (Ni), copper (Cu), and aluminum (Al)).

The first chip structure CST1 may be provided on the top surface of the substrate 10. The first chip structure CST1 may be provided as a single semiconductor package. The first chip structure CST1 may include a chip stack CS, a third semiconductor chip 300 disposed on the chip stack CS, and a first mold layer 400 enclosing the chip stack CS. The chip stack CS may include a first semiconductor chip 100 and second semiconductor chips 200, which are vertically stacked on the first semiconductor chip 100. Hereinafter, the structure of the chip stack CS will be described in more detail.

The first semiconductor chip 100 may be provided. The first semiconductor chip 100 may have a front surface and a rear surface. In the present specification, the front surface may be a surface of a semiconductor chip, which is called an active surface, and on which integrated devices are formed, and the rear surface may be another surface of the semiconductor chip that is opposite to the front surface. The first semiconductor chip 100 may be disposed on the substrate 10 in a face up manner such that the rear surface of the first semiconductor chip 100 may face the substrate 10. In other words, the bottom surface of the first semiconductor chip 100 may be the rear surface of the first semiconductor chip 100, and the top surface of the first semiconductor chip 100 may be the front surface of the first semiconductor chip 100. The first semiconductor chip 100 may include a first semiconductor substrate 110, a first circuit layer 120 provided on a top surface of the first semiconductor substrate 110, and first penetration vias 112 vertically penetrating the first semiconductor substrate 110.

The first semiconductor substrate 110 may include a semiconductor substrate. The first semiconductor substrate 110 may be a silicon substrate, a silicon-on-insulator (SOI) substrate, a germanium (Ge) substrate, a germanium-on-insulator (GOI) substrate, a silicon-germanium (SiGe) substrate, a group III-V semiconductor substrate, or a substrate including an epitaxial film formed by a selective epitaxial growth (SEG) process. The first semiconductor substrate 110 may be formed of or include at least one of silicon (Si), germanium (Ge), silicon-germanium (SiGe), gallium arsenic (GaAs), indium gallium arsenic (InGaAs), or aluminum gallium arsenic (AlGaAs). An integrated device or an integrated circuit may be provided on the top surface of the first semiconductor substrate 110. The integrated circuit may include a memory circuit. In other words, the first semiconductor chip 100 may be a memory chip.

The first circuit layer 120 may be provided on the top surface of the first semiconductor substrate 110. The first circuit layer 120 may be electrically connected to the integrated device or the integrated circuits, which are formed on the top surface of the first semiconductor substrate 110. For example, although not shown, the first circuit layer 120 may include a first insulating pattern and a first circuit pattern, which is provided in the first insulating pattern. The first insulating pattern may be provided on the top surface of the first semiconductor substrate 110 to cover the integrated device or the integrated circuits. The first circuit pattern may be electrically connected to the integrated device or the integrated circuits, which are formed on the first semiconductor substrate 110.

First chip pads 122 may be provided on a top surface of the first circuit layer 120. Although not shown, the first chip pads 122 may be electrically connected to the first circuit pattern of the first circuit layer 120. For example, the first chip pads 122 may be in contact with a portion of the first circuit pattern, which is exposed to the outside of the first insulating pattern near a top surface of the first insulating pattern. The first chip pads 122 may include a conductive material. For example, the first chip pads 122 may be formed of or include at least one of metallic materials (e.g., copper (Cu), aluminum (Al), tungsten (W), and titanium (Ti)).

Figure 3:
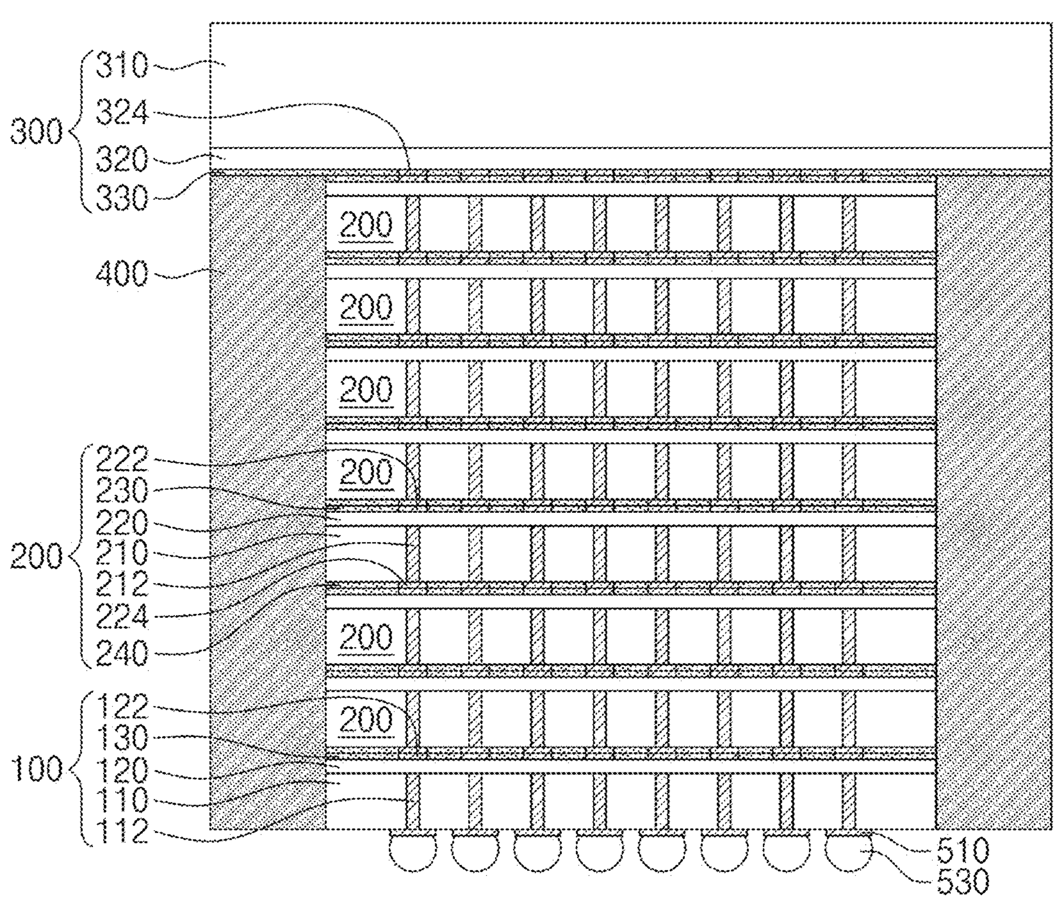

In an example embodiment, a first insulating layer 130 may be provided on the top surface of the first circuit layer 120 to enclose the first chip pads 122. As shown in FIG. 3, the first insulating layer 130 may cover the top surface of the first circuit layer 120 and may expose the first chip pads 122. A top surface of the first insulating layer 130 and a top surface of the first chip pads 122 may be substantially flat and may be substantially coplanar with each other. The first insulating layer 130 may include an insulating material. For example, the first insulating layer 130 may be formed of or include at least one of silicon nitride (SiN), silicon oxide (SiO), silicon oxynitride (SiON), or tetraethyl orthosilicate (TEOS). The following description will be given with reference to the example embodiment of FIGS. 1 and 2.

The first penetration vias 112 may be provided to vertically penetrate the first semiconductor substrate 110. The first penetration vias 112 may be extended toward the top surface of the first semiconductor chip 100 and may be connected to the first circuit layer 120 or the integrated device or the integrated circuits, which are formed on the top surface of the first semiconductor substrate 110. In an example embodiment, although not shown, the first penetration vias 112 may be coupled to the first circuit pattern of the first circuit layer 120.

The first penetration vias 112 may be extended toward the bottom surface of the first semiconductor chip 100 and may be connected to first pads 510, which will be described below.

A second semiconductor chip 200 may be provided on a top surface of the first semiconductor chip 100. The second semiconductor chip 200 may be of the same kind as the first semiconductor chip 100. In other words, the second semiconductor chip 200 may include a memory chip (e.g., a DRAM, SRAM, MRAM, or FLASH memory chip). The second semiconductor chip 200 may be disposed on the first semiconductor chip 100 in a face-up manner. For example, the second semiconductor chip 200 may have a rear surface facing the top surface of the first semiconductor chip 100. That is, a bottom surface of the second semiconductor chip 200 may be the rear surface of the second semiconductor chip 200, and a top surface of the second semiconductor chip 200 may be the front surface of the second semiconductor chip 200. The second semiconductor chip 200 may include a second semiconductor substrate 210, a second circuit layer 220 provided on the top surface of the second semiconductor substrate 210, and second penetration vias 212 provided to penetrate the second semiconductor substrate 210.

The second semiconductor substrate 210 may include a semiconductor substrate. For example, the second semiconductor substrate 210 may be a silicon substrate, a silicon-on-insulator (SOI) substrate, a germanium (Ge) substrate, a germanium-on-insulator (GOI) substrate, a silicon-germanium (SiGe) substrate, a group III-V semiconductor substrate, or a substrate including an epitaxial film formed by a selective epitaxial growth (SEG) process. The second semiconductor substrate 210 may be formed of or include at least one of silicon (Si), germanium (Ge), silicon-germanium (SiGe), gallium arsenic (GaAs), indium gallium arsenic (InGaAs), or aluminum gallium arsenic (AlGaAs). Integrated circuits (e.g., memory circuits) or integrated devices may be formed on the top surface of the second semiconductor substrate 210.

The second circuit layer 220 may be provided on the top surface of the second semiconductor substrate 210. The second circuit layer 220 may be electrically connected to the integrated devices or the integrated circuits, which are formed on the top surface of the second semiconductor substrate 210. For example, although not shown, the second circuit layer 220 may include a second insulating pattern and a second circuit pattern, which is provided in the second insulating pattern. Here, the second insulating pattern may be provided on the top surface of the second semiconductor substrate 210 to cover the integrated devices or the integrated circuits. The second circuit pattern may be electrically connected to the integrated device or the integrated circuit formed on the second semiconductor substrate 210.

Front-side pads 222 may be provided on a top surface of the second circuit layer 220. The front-side pad 222 may be a portion of the second circuit pattern, which is exposed from the second insulating pattern of the second semiconductor chip 200, or an additional pad, which is placed on the second insulating pattern and is connected to the second circuit pattern. The front-side pads 222 may include a conductive material. For example, the front-side pads 222 may be formed of or include at least one of metallic materials (e.g., copper (Cu), aluminum (Al), tungsten (W), and titanium (Ti)).

In an example embodiment, a second insulating layer 230 may be provided on the top surface of the second circuit layer 220 to enclose the front-side pads 222. As shown in FIG. 3, the second insulating layer 230 may cover the top surface of the second circuit layer 220 and may expose the front-side pads 222. A top surface of the second insulating layer 230 and top surfaces of the front-side pads 222 may be substantially flat and may be substantially coplanar with each other. The second insulating layer 230 may include an insulating material. For example, the second insulating layer 230 may be formed of or include at least one of silicon nitride (SiN), silicon oxide (SiO), silicon oxynitride (SiON), or tetraethyl orthosilicate (TEOS). The following description will be given with reference to the example embodiment of FIGS. 1 and 2.

The second penetration vias 212 may be provided to vertically penetrate the second semiconductor substrate 210. The second penetration vias 212 may be extended toward the top surface of the second semiconductor chip 200 and may be connected to the second circuit layer 220 or the integrated devices or the integrated circuits, which are formed on the top surface of the second semiconductor substrate 210. The second penetration vias 212 may be extended toward the bottom surface of the second semiconductor chip 200 and may be exposed to the outside of the second semiconductor chip 200 near or from the bottom surface of the second semiconductor chip 200.

Back-side pads 224 may be provided on the bottom surface of the second semiconductor chip 200. The back-side pads 224 may be electrically connected to the second penetration vias 212. The back-side pads 224 may include a conductive material. For example, the back-side pads 224 may be formed of or include at least one of metallic materials (e.g., copper (Cu), aluminum (Al), tungsten (W), and titanium (Ti)).

In an example embodiment, a third insulating layer 240 may be provided on the bottom surface of the second semiconductor chip 200 to enclose the back-side pads 224. As shown in FIG. 3, the third insulating layer 240 may cover the bottom surface of the second semiconductor chip 200 and may expose the back-side pads 224. A bottom surface of the third insulating layer 240 and bottom surfaces of the back-side pads 224 may be substantially flat and may be substantially coplanar with each other. The third insulating layer 240 may include an insulating material. For example, the third insulating layer 240 may be formed of or include at least one of silicon nitride (SiN), silicon oxide (SiO), silicon oxynitride (SiON), or tetraethyl orthosilicate (TEOS). The following description will be given with reference to the example embodiment of FIGS. 1 and 2.

The second semiconductor chip 200 may be mounted on the first semiconductor chip 100. Connection bumps 250 may be interposed between the first semiconductor chip 100 and the second semiconductor chip 200. for example, the connection bumps 250 may be interposed between the first chip pads 122 and the back-side pads 224 of the second semiconductor chip 200. Accordingly, the first semiconductor chip 100 and the second semiconductor chip 200 may be spaced apart from each other. The first semiconductor chip 100 and the second semiconductor chip 200 may be electrically connected to each other using the connection bumps 250. The connection bumps 250 may be solder balls or solder bumps, which are formed of an alloy containing at least one of tin (Sn), silver (Ag), copper (Cu), nickel (Ni), bismuth (Bi), indium (In), antimony (Sb), or cerium (Ce). In some example embodiments, the first chip pads 122 and the back-side pads 224 may be in direct contact with each other, without the connection bumps 250 interposed therebetween. As shown in FIG. 3, the first chip pads 122 of the first semiconductor chip 100 may be vertically aligned to the back-side pads 224 of the second semiconductor chip 200. At an interface between the first semiconductor chip 100 and the lowermost one of the second semiconductor chips 200, each of the first chip pads 122 of the first semiconductor chip 100 may be in direct contact with each of the back-side pads 224 of the lowermost one of the second semiconductor chips 200. Here, each of the first chip pads 122 and each of the back-side pads 224 may form an inter-metal hybrid bonding structure. In the present specification, the hybrid bonding structure may mean a bonding structure that is formed by two materials, which are of the same kind and are fused at an interface therebetween. For example, unlike the illustrated structure, the first chip pads 122 and the back-side pads 224, which are bonded to each other, may have a continuous structure, and there may be no visible interface between the first chip pads 122 and the back-side pads 224. For example, the first chip pads 122 and the back-side pads 224 may be formed of the same material, and in this case, there may be no interface between the first chip pads 122 and the back-side pads 224. In other words, the first chip pads 122 and the back-side pads 224 may be provided as a single object (e.g., an integral body). For example, the first chip pads 122 and the back-side pads 224 may be bonded to form a single object. However, the inventive concepts are not limited to this example. As shown in FIG. 3, the first chip pads 122 and the back-side pads 224 may be provided as distinct elements, and in this case, there may be a visible or observable interface between the first chip pads 122 and the back-side pads 224. The first semiconductor chip 100 may be electrically connected to the second semiconductor chip 200 through the first chip pad 122. The following description will be given with reference to the example embodiment of FIGS. 1 and 2.

In an example embodiment, a plurality of second semiconductor chips 200 may be provided. For example, the second semiconductor chips 200, each of which has substantially the same structure as the second semiconductor chip 200 described above, may be stacked on the top surface of the first semiconductor chip 100. FIGS. 1 and 2 illustrate an example, in which seven second semiconductor chips 200 are stacked on the first semiconductor chip 100, but the inventive concepts are not limited to this example. For example, the number of the second semiconductor chips 200 may vary from 3 to 21.

Each of the second semiconductor chips 200 may be mounted on top of another one. Two adjacent ones of the second semiconductor chips 200 may be placed in a back-to-face manner and may be bonded to each other. For example, the connection bumps 250 may be provided between the second semiconductor chips 200. For example, the connection bumps 250 may be interposed between the front-side pads 222 and the back-side pads 224, which are respectively included in adjacent ones of the second semiconductor chips 200. Accordingly, the second semiconductor chips 200 may be spaced apart from each other. The second semiconductor chips 200 may be electrically connected to each other through the connection bumps 250. In some example embodiments, the front-side pads 222 of one of the second semiconductor chip 200 may be in direct contact with the back-side pads 224 of another of the second semiconductor chips 200 adjacent thereto, as shown in FIG. 3. Here, the front-side pads 222 and the back-side pads 224 may form an inter-metal hybrid bonding structure. For example, the front-side pads 222 and the back-side pads 224 may be made of the same material to form a single object. Accordingly, adjacent ones of the second semiconductor chips 200 may be electrically connected to each other. The following description will be given with reference to the example embodiment of FIGS. 1 and 2.

First under-fill layers 260 may be provided between the first semiconductor chip 100 and the lowermost one of the second semiconductor chips 200 and between the second semiconductor chips 200. The first under-fill layers 260 may fill a space between the first semiconductor chip 100 and the lowermost one of the second semiconductor chips 200 and spaces between the second semiconductor chips 200. The first under-fill layers 260 may enclose the first chip pads 122, the front-side pads 222, the back-side pads 224, and the connection bumps 250. FIGS. 1 and 2 illustrate an example, in which the side surfaces of each of the first under-fill layers 260 are aligned to the side surface of the first semiconductor chip 100 and the side surfaces of each of the second semiconductor chips 200, but the inventive concepts are not limited to this example. The first under-fill layers 260 may include portions that protrude in relation to the side surface of the first semiconductor chip 100 and the side surfaces of each of the second semiconductor chips 200. The first under-fill layer 260 may be a non-conductive layer. For example, the first under-fill layer 260 may include a non-conductive film (NCF) or a non-conductive paste (NCP). The first under-fill layer 260 may include an insulating polymer. For example, the first under-fill layer 260 may be formed of an epoxy-based material that does not contain a conductive particle.

The chip stack CS may be provided to have the afore-described structure. The side surface of the first semiconductor chip 100 and the side surfaces of each of the second semiconductor chips 200 may be substantially aligned to each other. In some example embodiments, although not shown, a width of the first semiconductor chip 100 may be larger than a width of the second semiconductor chip 200. In the present specification, the term “width” may refer to a distance between outer side surfaces that are opposite to each other in a direction parallel to the top surface of the substrate 10.

The third semiconductor chip 300 may be provided on the chip stack CS. A width of the third semiconductor chip 300 may be larger than a width of the chip stack CS. Here, the width of the chip stack CS may be defined as the largest value in the widths of the semiconductor chips constituting the chip stack CS. A thickness of the third semiconductor chip 300 may be larger than a thickness of the first semiconductor chip 100 and a thickness of the second semiconductor chip 200. In the present specification, the term "thickness" may refer to a distance between top and bottom surfaces that are opposite to each other in a direction perpendicular to the top surface of the substrate 10. The thickness of the third semiconductor chip 300 may range from about 100 μm to about 200 μm. Here, a height of the first chip structure CST1 (e.g., the shortest distance from a top surface of the third semiconductor chip 300 to the bottom surface of the first semiconductor chip 100) may range from about 700 μm to 800 about μm.

The third semiconductor chip 300 may have a front surface and a rear surface. The front surface of the third semiconductor chip 300 may face the top surface of the first semiconductor chip 100. That is, the third semiconductor chip 300 may be disposed on the chip stack CS in a face-down manner. In other words, the uppermost one of the second semiconductor chips 200 may be disposed on and bonded to the third semiconductor chip 300 in a face-to-face manner. The third semiconductor chip 300 may include a third semiconductor substrate 310 and a third circuit layer 320, which is provided on a bottom surface of the third semiconductor substrate 310.

The third semiconductor substrate 310 may include a semiconductor substrate. For example, the third semiconductor substrate 310 may be a silicon substrate, a silicon-on-insulator (SOI) substrate, a germanium (Ge) substrate, a germanium-on-insulator (GOI) substrate, a silicon-germanium (SiGe) substrate, a group III-V semiconductor substrate, or a substrate including an epitaxial film formed by a selective epitaxial growth (SEG) process. The third semiconductor substrate 310 may be formed of or include at least one of silicon (Si), germanium (Ge), silicon-germanium (SiGe), gallium arsenic (GaAs), indium gallium arsenic (InGaAs), or aluminum gallium arsenic (AlGaAs). An integrated device or an integrated circuit may be provided on a top surface of the third semiconductor substrate 310. The integrated circuit may include a logic circuit. For example, the third semiconductor chip 300 may be a logic chip.

The third circuit layer 320 may be provided on the bottom surface of the third semiconductor substrate 310. The third circuit layer 320 may be electrically connected to the integrated device or the integrated circuits, which are formed on the bottom surface of the third semiconductor substrate 310. For example, although not shown, the third circuit layer 320 may include a third insulating pattern and a third circuit pattern provided in the third insulating pattern. On the bottom surface of the third semiconductor substrate 310, the third insulating pattern may cover the integrated device or the integrated circuits. The third circuit pattern may be electrically connected to the integrated device or the integrated circuits formed on the third semiconductor substrate 310.

Second chip pads 324 may be provided on a bottom surface of the third circuit layer 320. Although not shown, the second chip pads 324 may be electrically connected to the third circuit pattern of the third circuit layer 320. For example, the second chip pads 324 may be in contact with a portion of the third circuit pattern exposed to the outside of the third insulating pattern near or from a bottom surface of the third insulating pattern. The second chip pads 324 may include a conductive material. For example, the second chip pads 324 may be formed of or include at least one of metallic materials (e.g., copper (Cu), aluminum (Al), tungsten (W), and titanium (Ti)).

In an example embodiment, a fourth insulating layer 330 may be provided on the front surface (e.g., bottom surface) of the third semiconductor chip 300 to enclose the second chip pads 324, as shown in FIG. 3. The fourth insulating layer 330 may be provided to cover the front surface (e.g., bottom surface) of the third semiconductor chip 300 while exposing the second chip pads 324. A bottom surface of the fourth insulating layer 330 and bottom surfaces of the second chip pads 324 may be substantially coplanar with each other and may be substantially flat. The fourth insulating layer 330 may include an insulating material. For example, the fourth insulating layer 330 may be formed of or include silicon nitride (SiN), silicon oxide (SiO), silicon oxynitride (SiON), or tetraethyl orthosilicate (TEOS).

Figure 4:
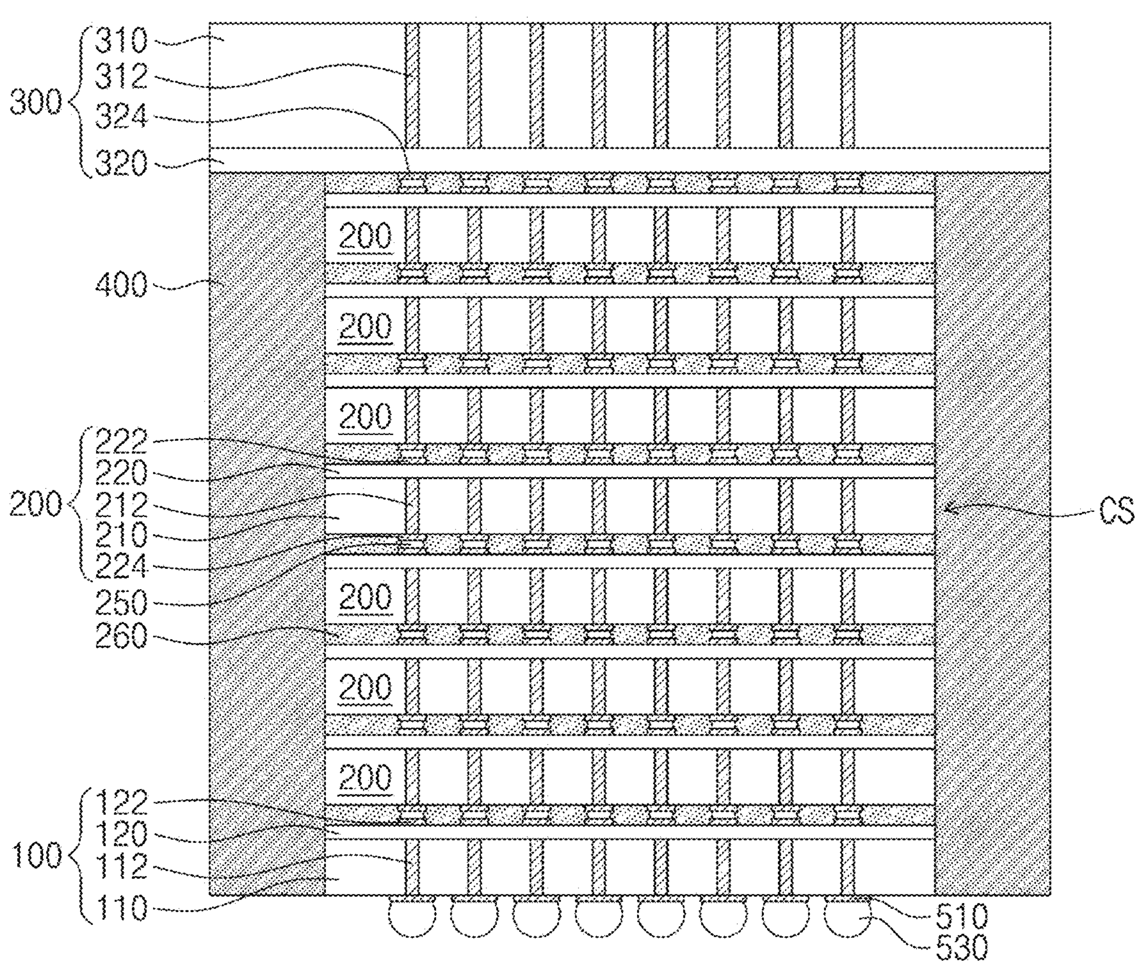

In an example embodiment, the third semiconductor chip 300 may include third penetration vias 312 which are provided in the third semiconductor substrate 310. As shown in FIG. 4, the third penetration vias 312 may be provided to vertically penetrate the third semiconductor substrate 310. The third penetration vias 312 may be extended toward the front surface of the third semiconductor chip 300 and may be connected to the third circuit layer 320 or the integrated device or the integrated circuits, which are formed on the front surface (e.g., bottom surface) of the third semiconductor substrate 310. The third penetration vias 312 may be extended toward the rear surface (e.g., top surface) of the third semiconductor chip 300 and may be exposed to the outside of the third semiconductor chip 300 near or from the rear surface (e.g., top surface) of the third semiconductor chip 300. Although not shown, a heat-dissipation structure may be disposed on the rear surface (e.g., top surface) of the third semiconductor chip 300. The third penetration vias 312 may be used to easily exhaust heat, which is generated in the third semiconductor chip 300, to the heat-dissipation structure. The following description will be given with reference to the example embodiment of FIGS. 1 and 2.

The third semiconductor chip 300 may be mounted on a top surface of the chip stack CS. For example, the third semiconductor chip 300 may be mounted on a top surface of the uppermost one of the second semiconductor chips 200. The third semiconductor chip 300 may be connected to the uppermost one of the second semiconductor chips 200 using the connection bumps 250 provided between the second chip pads 324 and the front-side pads 222 of the uppermost one of the second semiconductor chips 200. Accordingly, the uppermost one of the second semiconductor chips 200 may be spaced apart from the third semiconductor chip 300. Here, the first under-fill layer 260 may fill a space between the uppermost one of the second semiconductor chips 200 and the third semiconductor chip 300 and may enclose the second chip pads 324, the connection bumps 250 connected to the second chip pads 324, and the front-side pads 222 connected to the second chip pads 324 through the connection bumps 250. In some example embodiments, the second chip pads 324 and the front-side pads 222 may be in direct contact with each other, without the connection bumps 250 therebetween. As shown in FIG. 3, the second chip pads 324 of the third semiconductor chip 300 may be vertically aligned to the front-side pads 222 of the uppermost one of the second semiconductor chips 200. At an interface between the third semiconductor chip 300 and the uppermost one of the second semiconductor chips 200, the second chip pads 324 of the third semiconductor chip 300 may be in direct contact with the front-side pads 222 of the uppermost one of the second semiconductor chips 200. Here, the second chip pads 324 and the front-side pads 222 may form an inter-metal hybrid bonding structure. For example, unlike the illustrated structure, the second chip pads 324 and the front-side pads 222, which are bonded to each other, may have a continuous structure, and there may be no visible interface between the second chip pads 324 and the front-side pads 222. For example, the second chip pads 324 and the front-side pads 222 may be formed of the same material, and in this case, there may be no interface between the second chip pads 324 and the front-side pads 222. In other words, the second chip pads 324 and the front-side pads 222 may be provided as a single object. For example, the second chip pads 324 and the front-side pads 222 may be bonded to form a single object. However, the inventive concepts are not limited to this example. The second chip pads 324 and the front-side pads 222 may be provided as distinct elements, and in this case, there may be a visible interface between the second chip pads 324 and the front-side pads 222, as shown in FIG. 3. The third semiconductor chip 300 may be electrically connected to the uppermost one of the second semiconductor chips 200 through the second chip pad 324. The following description will be given with reference to the example embodiment of FIGS. 1 and 2.

The first mold layer 400 may be provided on a bottom surface of the third semiconductor chip 300. The first mold layer 400 on the bottom surface of the third semiconductor chip 300 may enclose the chip stack CS. A bottom surface of the first mold layer 400 may be coplanar with the bottom surface of the chip stack CS. A side surface of the first mold layer 400 may be aligned to a side surface of the third semiconductor chip 300. The first mold layer 400 may include an insulating polymer material. For example, the first mold layer 400 may include an epoxy molding compound (EMC).

Figure 5:
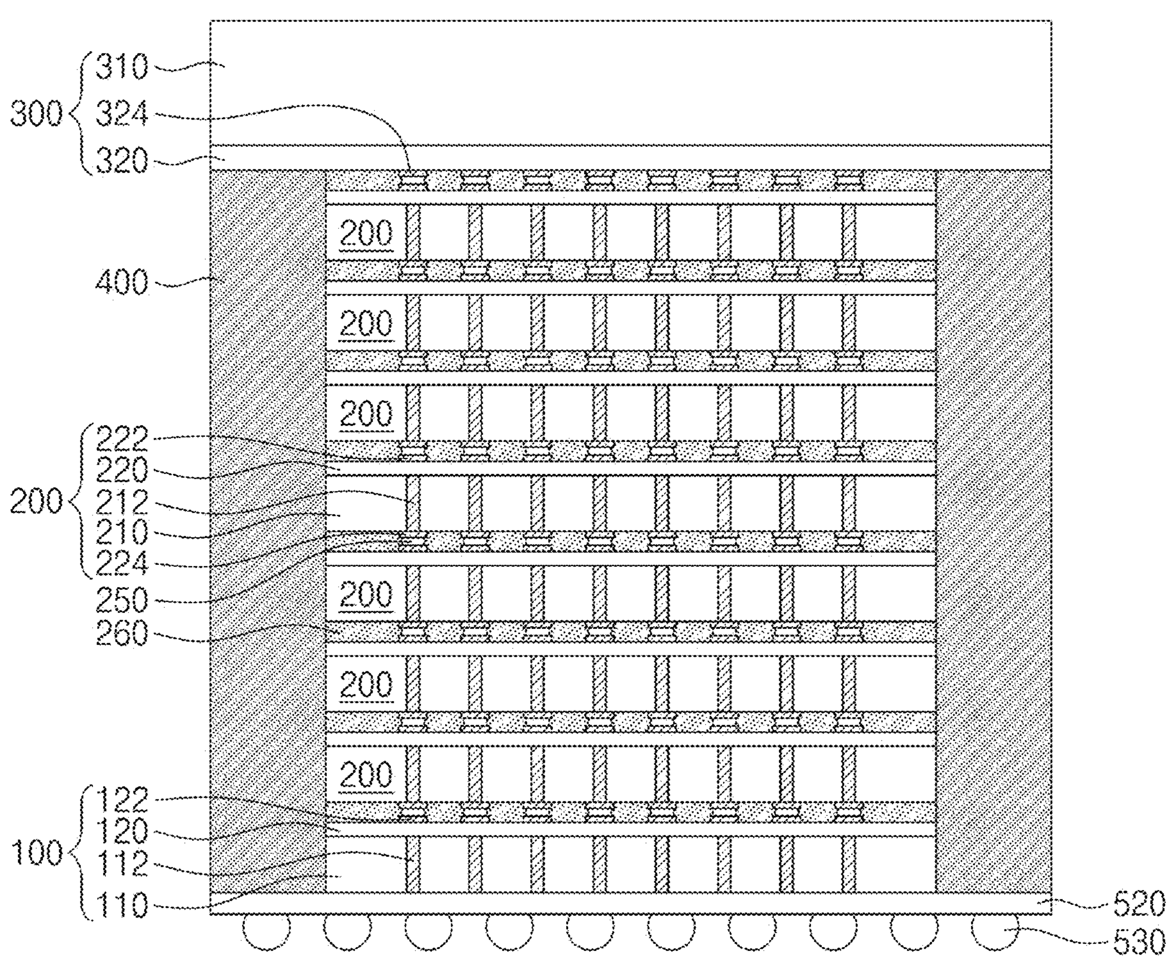

The first pads 510 may be provided on the bottom surface of the chip stack CS. The first pads 510 may be coupled to the first penetration vias 112, which are exposed to the outside of the first semiconductor chip 100 near or from the bottom surface of the first semiconductor chip 100. The first pads 510 may include a conductive material. For example, the first pads 510 may be formed of or include at least one of metallic materials (e.g., copper (Cu), aluminum (Al), tungsten (W), and titanium (Ti)). In some example embodiments, a redistribution layer 520 may be provided on the bottom surface of the chip stack CS. As shown in FIG. 5, the redistribution layer 520 on the bottom surface of the chip stack CS may be horizontally extended to be in contact with the bottom surface of the first mold layer 400. A side surface of the redistribution layer 520 may be aligned to a side surface of the chip stack CS. Although not shown, an interconnection pattern in the redistribution layer 520 may be connected to the first penetration vias 112. The following description will be given with reference to the example embodiment of FIGS. 1 and 2.

First connection terminals 530 may be provided on bottom surfaces of the first pads 510, respectively. The first connection terminals 530 may be outer terminals, which are used to connect the first chip structure CST1 to the substrate 10. The first connection terminals 530 may include solder balls or solder bumps. Depending on the kind and arrangement of the first connection terminals 530, the semiconductor package may be provided in the form of a ball grid array (BGA), a fine ball grid array (FBGA), or a land grid array (LGA). The first connection terminals 530 may include a conductive metal material. For example, the first connection terminals 530 may be formed of or include at least one of metallic materials (e.g., tin (Sn), lead (Pb), silver (Ag), zinc (Zn), nickel (Ni), copper (Cu), and aluminum (Al)).

The first chip structure CST1 may be provided to have the afore-described structure. The first chip structure CST1 may be mounted on the substrate 10. For example, the first chip structure CST1 may be coupled to substrate pads, which are disposed on the top surface of the substrate 10, through the first connection terminals 530. In other words, the first chip structure CST1 may be electrically connected to the substrate 10 through the first connection terminals 530. A bottom surface of the first chip structure CST1 may be spaced apart from the top surface of the substrate 10.

A second under-fill layer 540 may be provided between the top surface of the substrate 10 and the bottom surface of the first chip structure CST1. The second under-fill layer 540 may fill a space between the substrate 10 and the first chip structure CST1. The second under-fill layer 540 may enclose the first pads 510 and the first connection terminals 530.

The fourth semiconductor chip 600 may be provided on the substrate 10. The fourth semiconductor chip 600 on the substrate 10 may be horizontally spaced apart from the first chip structure CST1. The fourth semiconductor chip 600 may include a chip base layer 610 and a chip interconnection layer 620.

The chip base layer 610 may include a semiconductor substrate. For example, the chip base layer 610 may be a silicon substrate, a silicon-on-insulator (SOI) substrate, a germanium (Ge) substrate, a germanium-on-insulator (GOI) substrate, a silicon-germanium (SiGe) substrate, a group III-V semiconductor substrate, or a substrate including an epitaxial film formed by a selective epitaxial growth (SEG) process. The chip base layer 610 may be formed of or include at least one of silicon (Si), germanium (Ge), silicon-germanium (SiGe), gallium arsenic (GaAs), indium gallium arsenic (InGaAs), or aluminum gallium arsenic (AlGaAs). An integrated circuit may be provided on a bottom surface of the chip base layer 610. The integrated circuit may include a logic circuit or a memory circuit. That is, the fourth semiconductor chip 600 may be a logic chip or a memory chip. However, the inventive concepts are not limited to this example, and the fourth semiconductor chip 600 may include a logic chip, a memory chip, a semiconductor chip with other integrated circuit, or a passive device. A bottom surface of the fourth semiconductor chip 600 may be an active surface, and a top surface of the fourth semiconductor chip 600 may be an inactive surface. That is, the fourth semiconductor chip 600 may be disposed on the substrate 10 in a face-down manner. The chip interconnection layer 620 may be disposed on the bottom surface of the chip base layer 610. For example, the chip interconnection layer 620 may include a chip insulating pattern 622 and a chip interconnection pattern 624, which are formed on the bottom surface of the chip base layer 610. In an example embodiment, the chip interconnection layer 620 may further include a circuit pattern or a protection layer.

On the bottom surface of the chip base layer 610, the chip insulating pattern 622 may cover the integrated circuit. The chip insulating pattern 622 may include an insulating material. For example, the chip insulating pattern 622 may include silicon oxide (SiO), silicon nitride (SiN), silicon oxynitride (SiON), silicon carbonitride (SiCN), or insulating polymers. In some example embodiments, the chip insulating pattern 622 may include insulating polymers or photoimageable dielectric (PID) materials. Here, the PID materials may include at least one of photoimageable polyimide (PI), polybenzoxazole (PBO), phenol-based polymers, or benzocyclobutene-based polymers.

The chip interconnection pattern 624 may be provided in the chip insulating pattern 622. The chip interconnection pattern 624 may be electrically connected to the integrated circuit, which is formed on the bottom surface of the chip base layer 610. The chip interconnection pattern 624 may include a conductive material. For example, the chip interconnection pattern 624 may be formed of or include copper (Cu) or aluminum (Al).

The fourth semiconductor chip 600 may include third chip pads 626 provided on a bottom surface thereof. The third chip pads 626 may be disposed on the bottom surface of the fourth semiconductor chip 600 (e.g., the bottom surface of the chip interconnection layer 620). The third chip pads 626 may be exposed to the outside of the fourth semiconductor chip 600 near or from the bottom surface of the fourth semiconductor chip 600. The third chip pads 626 may be electrically connected to the integrated circuit, which is formed on the bottom surface of the chip base layer 610, through the chip interconnection pattern 624 in the chip interconnection layer 620.

The fourth semiconductor chip 600 may be mounted on the substrate 10. For example, the fourth semiconductor chip 600 may be mounted on the substrate 10 in a flip chip manner. For example, the fourth semiconductor chip 600 may be electrically connected to the substrate pads of the substrate 10 through second connection terminals 630. The second connection terminals 630 may be provided between the third chip pads 626 and the substrate pads of the substrate 10. The fourth semiconductor chip 600 may be electrically connected to the first chip structure CST1 through the second connection terminals 630 and the substrate 10. Because the second connection terminals 630 are used to mount the fourth semiconductor chip 600 on the substrate 10, the fourth semiconductor chip 600 may be spaced apart from the top surface of the substrate 10.

A third under-fill layer 640 may be provided between the top surface of the substrate 10 and the bottom surface of the fourth semiconductor chip 600. The third under-fill layer 640 may fill a space between the substrate 10 and the second under-fill layer 540. The third under-fill layer 640 may enclose the third chip pads 626 and the second connection terminals 630.

A second mold layer 700 may be provided on the substrate 10. The second mold layer 700 on the substrate 10 may enclose the fourth semiconductor chip 600 and the first chip structure CST1. The second mold layer 700 may cover the fourth semiconductor chip 600. In some example embodiments, a top surface of the fourth semiconductor chip 600 may be exposed to the outside of the second mold layer 700 near or from a top surface of the second mold layer 700. The top surface of the third semiconductor chip 300 of the first chip structure CST1 may be exposed to the outside of the second mold layer 700 near or from the top surface of the second mold layer 700. The top surface of the third semiconductor chip 300 may be coplanar with the top surface of the second mold layer 700. The second mold layer 700 on the top surface of the substrate 10 may fill a space between the fourth semiconductor chip 600 and the first chip structure CST1 and may enclose the second and third under-fill layers 540 and 640. The second mold layer 700 may include a molding member. In an example embodiment, the molding member may be formed of or include at least one of insulating polymer materials (e.g., an epoxy molding compound (EMC) or an Ajinomoto build-up film (ABF)).

FIG. 1 illustrates an example, in which the first chip structure CST1 and the fourth semiconductor chip 600 are directly mounted on the substrate 10, but the inventive concepts are not limited to this example. In an example embodiment, an interposer 20 may be provided between the substrate 10 and the first chip structure CST1 and between the substrate 10 and the fourth semiconductor chip 600. As shown in FIG. 6, the interposer 20 may be mounted on the top surface of the substrate 10 using third connection terminals 22, which are disposed on a bottom surface thereof. The first chip structure CST1 and the fourth semiconductor chip 600 may be mounted on a top surface of the interposer 20 using the first and second connection terminals 530 and 630, respectively. In addition, a second chip structure CST2 may be mounted on the top surface of the interposer 20 to be horizontally spaced apart from the fourth semiconductor chip 600 and the first chip structure CST1. The second chip structure CST2 may be provided to have substantially the same or similar structure as the first chip structure CST1. FIG. 6 illustrates an example, in which one second chip structure CST2 is provided, but the inventive concepts are not limited to this example. For example, at least two second chip structures CST2 may be provided. The second chip structures CST2 may be mounted on the top surface of the interposer 20 to be horizontally spaced apart from the fourth semiconductor chip 600 and the first chip structure CST1. The fourth semiconductor chip 600 and the first and second chip structures CST1 and CST2 may be electrically connected to each other through the interposer 20.

A third mold layer 800 may be provided on the interposer 20. The third mold layer 800 on the interposer 20 may enclose the fourth semiconductor chip 600 and the first and second chip structures CST1 and CST2. The third mold layer 800 may cover the fourth semiconductor chip 600. In some example embodiments, the top surface of the fourth semiconductor chip 600 may be exposed to the outside of the third mold layer 800 near or from a top surface of the third mold layer 800. A top surface of each of the first and second chip structures CST1 and CST2 may be exposed to the outside of the third mold layer 800 near or from the top surface of the third mold layer 800. On the top surface of the interposer 20, the third mold layer 800 may fill a space between the fourth semiconductor chip 600 and the first and second chip structures CST1 and CST2. The third mold layer 800 may include a molding member. The molding member may be formed of or include at least one of insulating polymer materials (e.g., an epoxy molding compound (EMC) or an Ajinomoto build-up film (ABF)).

FIGS. 7 to 10 are sectional views illustrating a method of fabricating a chip structure according to an example embodiment of the inventive concepts.

Figure 7:
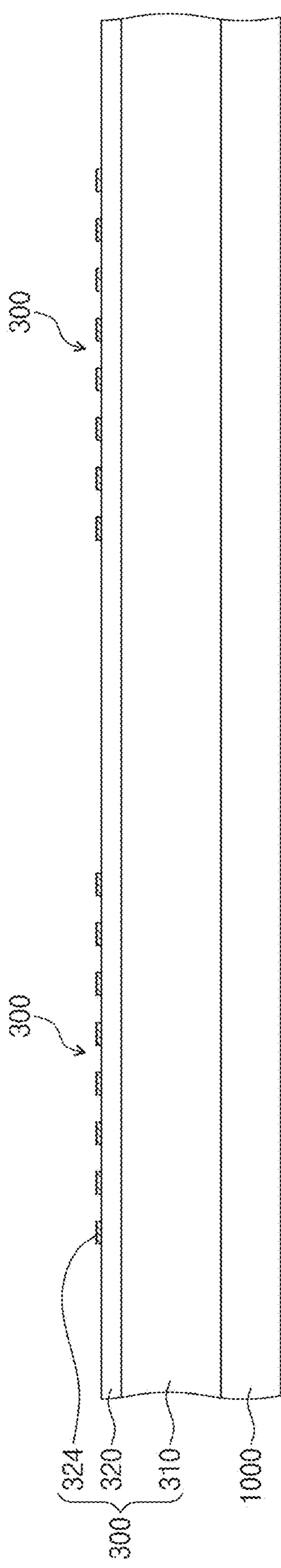
FIGS. 7 to 10 are sectional views illustrating a method of fabricating a chip structure, according to an example embodiment of the inventive concepts.

Referring to FIG. 7, a carrier substrate 1000 may be provided. The carrier substrate 1000 may be an insulating substrate, which is formed of or includes glass or polymer, or a conductive substrate, which is formed of or includes a metallic material. Although not shown, an adhesive member may be provided on a top surface of the carrier substrate 1000. As an example, the adhesive member may include an adhesive tape.

The third semiconductor substrate 310 may be provided on the carrier substrate 1000. The third semiconductor substrate 310 may be provided in the form of a semiconductor wafer. The third semiconductor chips 300 may be fabricated by performing a semiconductor fabrication process on the third semiconductor substrate 310. for example, integrated circuits including transistors may be formed on the top surface of the third semiconductor substrate 310. Although not shown, an insulating material may be deposited on the top surface of the third semiconductor substrate 310 and may be patterned to form a third insulating pattern. A conductive material may be deposited on the third insulating pattern and may be patterned to form a third circuit pattern. The third circuit layer 320 may be formed as a result of the process of forming the third insulating pattern and the third circuit pattern. An insulating material may be deposited on the third circuit layer 320 and may be patterned to form an opening exposing the third circuit pattern, and then, the second chip pads 324 may be formed by filling the opening with a conductive material. In an example embodiment, at least a portion of the insulating materials enclosing the second chip pads 324 may be removed. In some example embodiments, as shown in FIG. 3, the insulating materials may be patterned to expose the top surfaces of the second chip pads 324 and form the fourth insulating layer 330. The following description will be given with reference to the example embodiment of FIG. 7. A thickness of each of the third semiconductor chips 300 may range from 100 μm to 200 μm.

Figure 8:
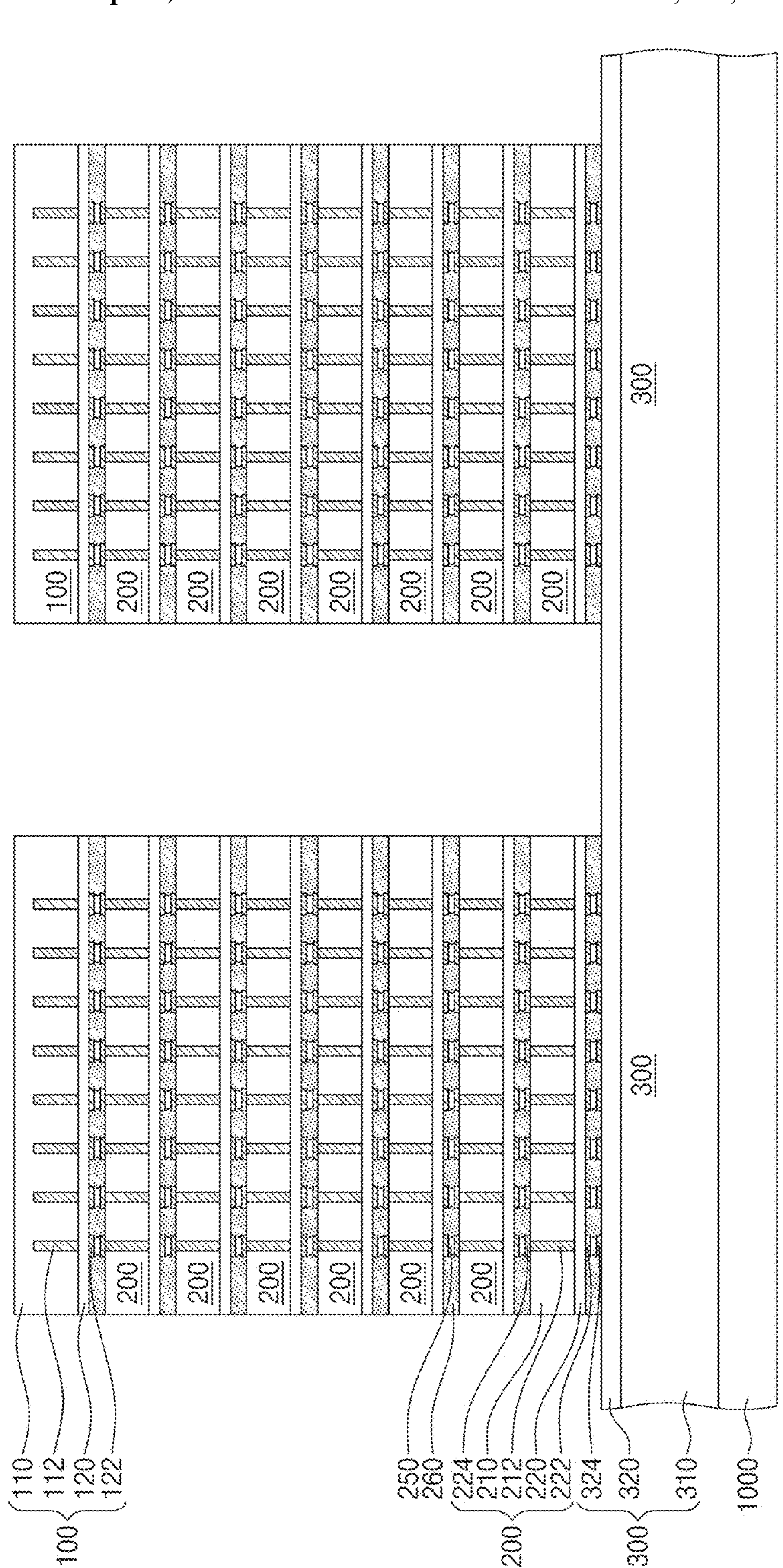

The third semiconductor chips 300 may be placed on and attached to the carrier substrate 1000. The third semiconductor chips 300 may be attached to the carrier substrate 1000 using the adhesive member, and here, an inactive surface of each of the third semiconductor chips 300 may be disposed to face the carrier substrate 1000. Referring to FIG. 8, a plurality of chip stacks CS may be formed on the third semiconductor chips 300. The chip stacks CS on the third semiconductor chips 300 may be horizontally spaced apart from each other. The description that follows will refer to one third semiconductor chip 300 and one chip stack CS.

The second semiconductor chips 200 may be mounted on the third semiconductor chip 300. The second semiconductor chips 200 may be manufactured by various fabrication methods, which are independent of methods that are used to fabricate the chip structure. An integrated circuit including a transistor may be formed on a bottom surface of the second semiconductor substrate 210. Next, the second penetration vias 212 may be formed by forming penetration holes to penetrate the second semiconductor substrate 210 and filling the penetration holes with a conductive material. Here, the penetration holes may be extended from the bottom surface of the second semiconductor substrate 210 and may be exposed to the outside of the second semiconductor substrate 210 near or from the top surface of the second semiconductor substrate 210. Although not shown, an insulating material may be deposited on the bottom surface of the second semiconductor substrate 210 and may be patterned to form a second insulating pattern. A conductive material may be deposited on the second insulating pattern and may be patterned to form a second circuit pattern. The second circuit layer 220 may be formed as a result of the process of forming the second insulating pattern and the second circuit pattern. An insulating material may be deposited on the second circuit layer 220 and may be patterned to form an opening exposing the second circuit pattern, and then, the front-side pads 222 may be formed by filling the opening with a conductive material. In addition, an insulating material may be deposited on the top surface of the second semiconductor substrate 210 and may be patterned to form an opening exposing the second penetration vias 212, and then, the back-side pads 224 may be formed by filling the opening with a conductive material. In an example embodiment, the insulating materials enclosing the front-side pads 222 and the back-side pads 224 may be removed. For example, as shown in FIG. 3, the insulating materials may be patterned to form the second insulating layer 230 exposing the top surfaces of the front-side pads 222 and the third insulating layer 240 exposing the bottom surfaces of the back-side pads 224. The following description will be given with reference to the example embodiment of FIG. 8.

The second semiconductor chips 200 may be stacked on the third semiconductor chip 300 such that an active surface of each of the second semiconductor chips 200 faces the third semiconductor chip 300. The description that follows will refer to one of the second semiconductor chips 200. The connection bumps 250 and the first under-fill layer 260 enclosing them may be formed on the bottom surface of the second semiconductor chip 200 (e.g., the front-side pads 222 of the second circuit layer 220). In the case where the first under-fill layer 260 is a non-conductive paste (NCP), the first under-fill layer 260 may be formed by a method of dispensing a liquid non-conductive adhesive material on the second semiconductor chip 200. In the case where the first under-fill layer 260 is a non-conductive film (NCF), the first under-fill layer 260 may be formed by a method of attaching a non-conductive film to the second semiconductor chip 200. The second semiconductor chip 200 may be formed such that the front-side pads 222 of the second semiconductor chip 200 are aligned to the second chip pads 324 of the third semiconductor chip 300. Thereafter, the second semiconductor chip 200 may be bonded to the third semiconductor chip 300 through, for example, a thermocompression bonding process. For example, the connection bumps 250 may be in contact with the front-side pads 222 and the second chip pads 324. Accordingly, the second semiconductor chip 200 may be connected to the third semiconductor chip 300 through using the connection bumps 250. As the thermocompression process continues, the first under-fill layer 260 may be partially hardened by heat supplied to the second semiconductor chip 200.

The afore-described process may be repeated to form a plurality of second semiconductor chips 200, which are to be sequentially stacked on the lowermost one of the second semiconductor chips 200. For example, the second semiconductor chips 200 may be disposed such that the front-side pads 222 in each of the second semiconductor chip 200 are aligned to the back-side pads 224 in another of the second semiconductor chips 200 adjacent thereto. Thereafter, the second semiconductor chips 200 may be bonded to each other through a thermocompression bonding process.

The first semiconductor chip 100 may be mounted on the uppermost one of the second semiconductor chips 200. The first semiconductor chip 100 may be manufactured by various fabrication methods, which are different from the methods that are used to fabricate the chip structure and the second semiconductor chip 200. For example, the first semiconductor chips 100 may be fabricated by performing a semiconductor fabrication process on the first semiconductor substrate 110. For example, an integrated circuit including a transistor may be formed on a bottom surface of the first semiconductor substrate 110. Next, the first penetration vias 112 may be formed by forming penetration holes to penetrate the first semiconductor substrate 110 and filling the penetration holes with a conductive material. Here, the penetration holes may be extended from the bottom surface of the first semiconductor substrate 110 toward the top surface of the first semiconductor substrate 110, but the penetration holes may not completely penetrate the first semiconductor substrate 110. Accordingly, the first penetration vias 112 may not be exposed to the outside of the first semiconductor substrate 110 near or from the top surface of the first semiconductor substrate 110. Although not shown, an insulating material may be deposited on the bottom surface of the first semiconductor substrate 110 and may be patterned to form a first insulating pattern. A conductive material may be deposited on the first insulating pattern and may be patterned to form a first circuit pattern. The first circuit layer 120 may be formed, as a result of the process of forming the first insulating pattern and the first circuit pattern. An insulating material may be deposited on the first circuit layer 120 and may be patterned to form an opening exposing the first circuit pattern, and then, the first chip pads 122 may be formed by filling the opening with a conductive material. In an example embodiment, at least a portion of the insulating materials enclosing the first chip pads 122 may be removed. For example, as shown in FIG. 3, the insulating materials may be patterned to expose the bottom surfaces of the first chip pads 122 and form the first insulating layer 130. The following description will be given with reference to the example embodiment of FIG. 8.

The first semiconductor chip 100 may be mounted on the uppermost one of the second semiconductor chips 200 such that the active surface of the first semiconductor chip 100 faces the second semiconductor chip 200. For example, the connection bumps 250 and the first under-fill layer 260 enclosing the connection bumps 250 may be formed on the bottom surface of the first semiconductor chip 100 (e.g., the first chip pads 122 of the first circuit layer 120). The first semiconductor chip 100 may be disposed such that the first chip pads 122 of the first semiconductor chip 100 are aligned to the back-side pads 224 of the uppermost one of the second semiconductor chips 200. Thereafter, the first semiconductor chip 100 may be bonded to the uppermost one of the second semiconductor chips 200 by, for example, a thermocompression bonding process. For example, the connection bumps 250 may be in contact with the first chip pads 122 and the back-side pads 224. Accordingly, the first semiconductor chip 100 may be electrically connected to the uppermost one of the second semiconductor chips 200 through the connection bumps 250.

In an example embodiment, the thermocompression bonding process may be simultaneously performed on the first and second semiconductor chips 100 and 200. For example, the first and second semiconductor chips 100 and 200 may be stacked on the third semiconductor chip 300, and then, a thermocompression bonding process may be performed on the first and second semiconductor chips 100 and 200 to reflow the connection bumps 250. Although not shown, portions of the first under-fill layers 260 may protrude outward in relation to the side surface of the second semiconductor chip 200, during the thermocompression bonding process.

In a semiconductor package according to an example embodiment of the inventive concepts, the first and second semiconductor chips 100 and 200 may be stacked on the third semiconductor chip 300 having a large thickness, and thus, it may be possible to mitigate or prevent the third semiconductor chip 300 from being cracked by heat and pressure in the process of stacking the first and second semiconductor chips 100 and 200. This may make it possible to reduce a failure rate associated with the third semiconductor chip 300 (e.g., the logic chip) of the semiconductor package.

Figure 9:
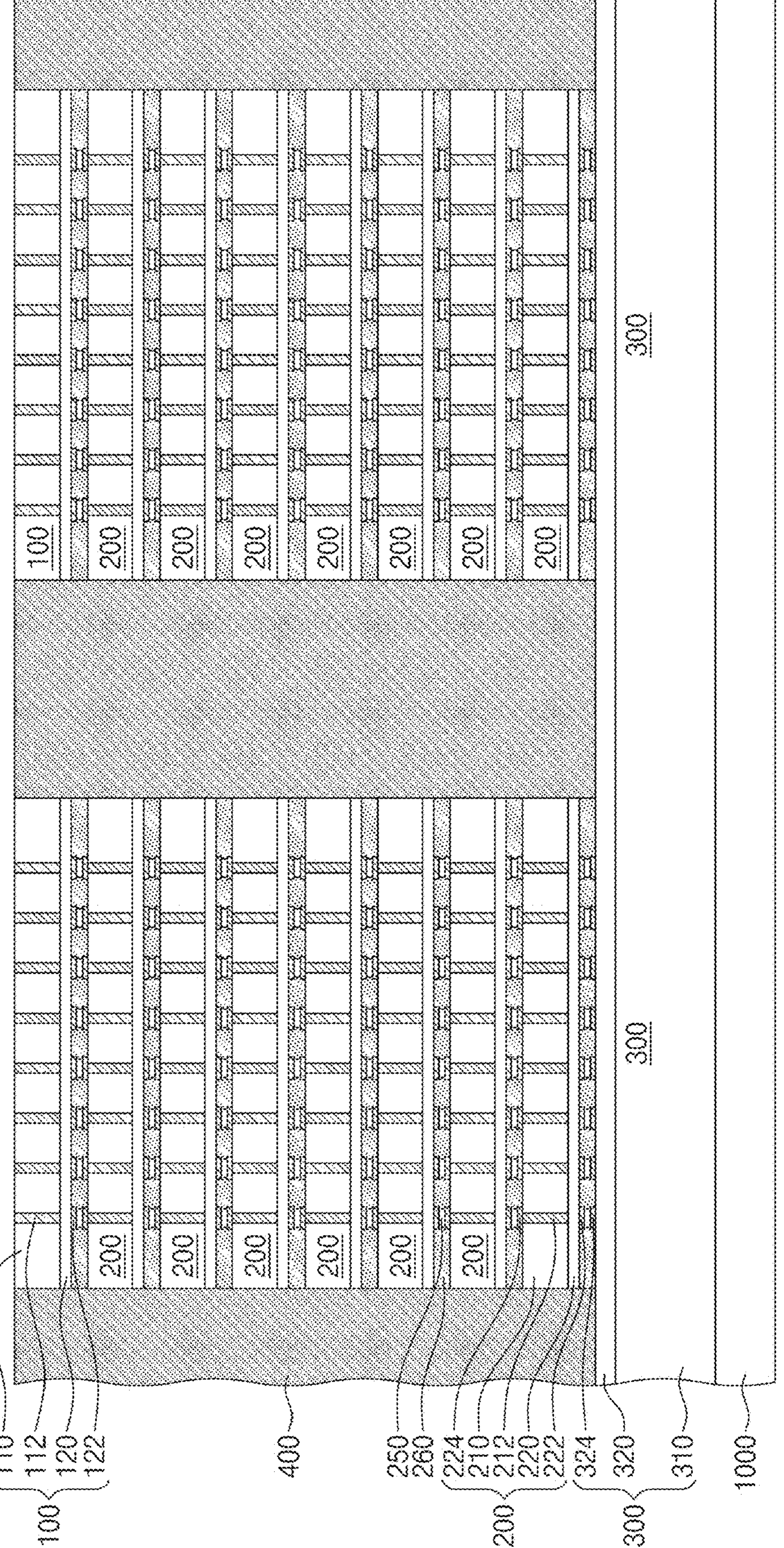

Referring to FIG. 9, the first mold layer 400 may be formed on the third semiconductor chip 300. For example, the first mold layer 400 may be formed by coating a molding member on the third semiconductor chip 300 to cover the chip stacks CS and hardening the molding member. Thereafter, a grinding process or a chemical mechanical polishing (CMP) process may be performed on a top surface of the first mold layer 400. Accordingly, a portion of the first mold layer 400 may be removed. The grinding process or the chemical mechanical polishing process may be performed to expose top surfaces of the first penetration vias 112 of the first semiconductor chip 100.

Figure 10:
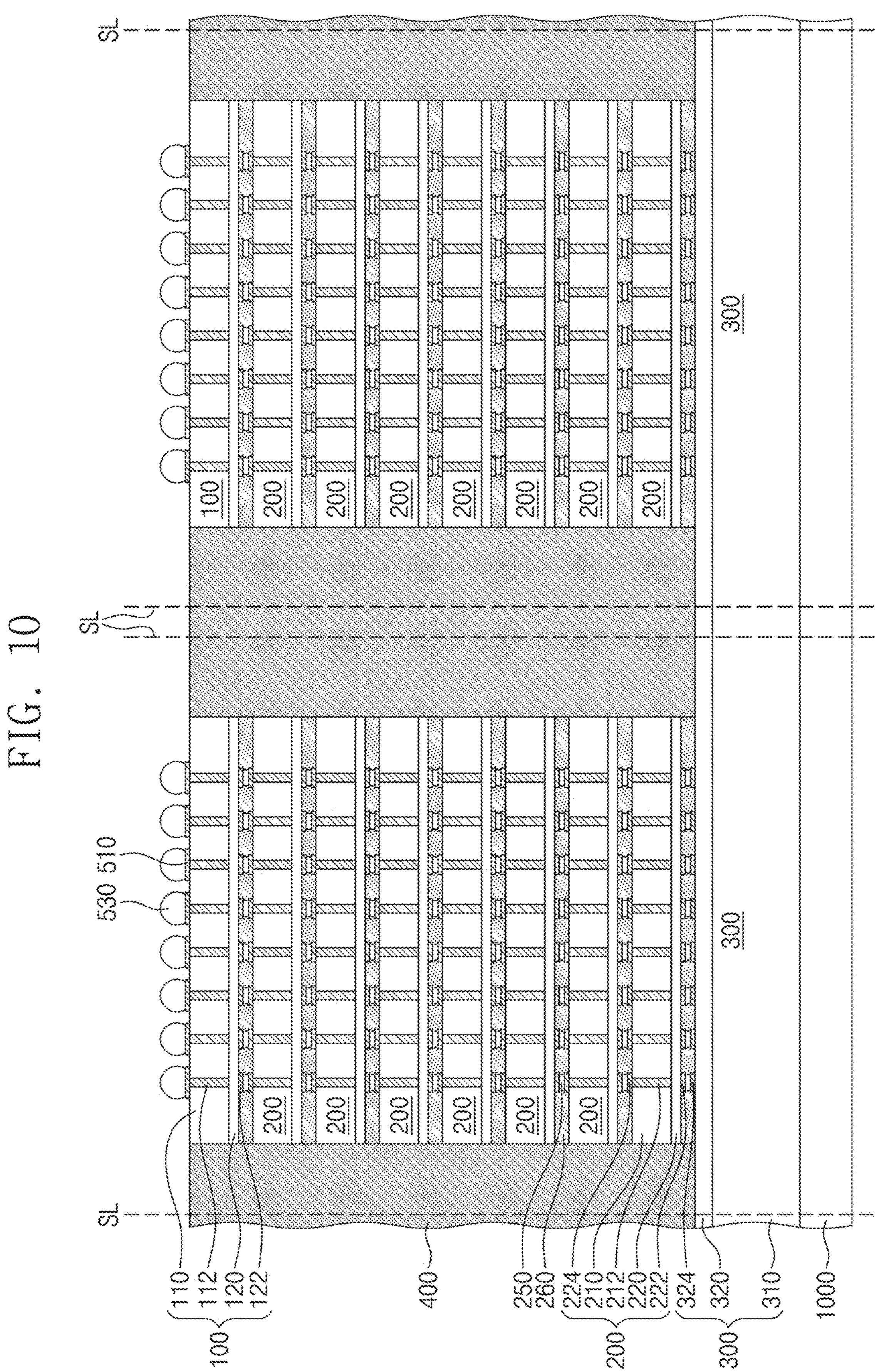

Referring to FIG. 10, the first pads 510 and the first connection terminals 530 may be formed on the structure of FIG. 9. An insulating material may be deposited or coated on the top surface of each of the chip stacks CS and the top surface of the first mold layer 400 and may be patterned to form openings exposing the first penetration vias 112. The first pads 510 may be formed by filling the openings with a conductive material. A strip process may be performed to remove the insulating materials, after the formation of the first pads 510. Thereafter, connection terminals (e.g., solder balls or solder bumps) may be attached to the first pads 510.

According to an example embodiment of the inventive concepts, the outer terminals may be formed on the top surface of the first semiconductor chip 100, after the process of stacking the first and second semiconductor chips 100 and 200, and thus, it may be possible to mitigate or prevent the first connection terminals 530 from being deformed by heat and pressure in the process of stacking the first and second semiconductor chips 100 and 200. As a result, the semiconductor package may be fabricated to have a low failure rate associated with the connection terminals.

A sawing process may be performed on the third semiconductor substrate 310 and the first mold layer 400. The sawing process may be performed along a sawing line SL. Next, the carrier substrate 1000 may be removed. As a result of the sawing process, the first chip structures CST1 may be separated from each other and may have the structure described with reference to FIG. 2.

In a semiconductor package according to an example embodiment of the inventive concepts, by stacking a plurality of semiconductor chips on a thick buffer chip, it may be possible to mitigate or prevent the buffer chip from being cracked by heat and pressure in a process of stacking the semiconductor chips. Thus, it may be possible to realize a semiconductor package where a failure rate associated with the buffer chip is lowered.

In addition, by forming outer terminals on a top surface of the uppermost one of the semiconductor chips after the stacking of the semiconductor chips, it may be possible to mitigate or prevent the outer terminals from being deformed by heat and pressure in the process of stacking the semiconductor chips. This may make it possible to reduce a failure rate associated with the outer terminals of the semiconductor package.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:

a package substrate;

a chip stack;

a first semiconductor chip on a top surface of the chip stack;

outer terminals on a bottom surface of the chip stack; and a mold layer on a bottom surface of the first semiconductor chip and enclosing the chip stack, wherein the chip stack comprises;

a second semiconductor chip comprising first penetration vias, the first penetration vias penetrating the second semiconductor chip, the first penetration vias exposed to an outside of the second semiconductor chip from a bottom surface thereof, and third semiconductor chips stacked on a top surface of the second semiconductor chip, and wherein each of the third semiconductor chips comprises second penetration vias penetrating therethrough and exposed to an outside thereof from a bottom surface thereof, a width of the first semiconductor chip is larger than a width of each of the third semiconductor chips and larger than a width of the second semiconductor chip, the second semiconductor chip is a bottommost chip between the package substrate and the first semiconductor chip, and the first semiconductor chip comprises a logic chip.

2. The semiconductor package of claim 1, wherein the second semiconductor chip and each of the third semiconductor chips are chips including memory elements.

3. The semiconductor package of claim 1, wherein a thickness of the first semiconductor chip ranges from 100 μm to 200 μm.

4. The semiconductor package of claim 1, wherein a side surface of the second semiconductor chip is vertically aligned to a side surface of each of the third semiconductor chips.

5. The semiconductor package of claim 1, further comprising: first connection terminals on the bottom surface of the first semiconductor chip; and second connection terminals on the bottom surface of each of the third semiconductor chips, wherein the first semiconductor chip is electrically connected to an uppermost third semiconductor chip of the third semiconductor chips through the first connection terminals, each of the third semiconductor chips is electrically connected to another third semiconductor chip of the third semiconductor chips or the second semiconductor chip through the second connection terminals, and each of the first and second connection terminals comprises a solder ball or a solder bump.

6. The semiconductor package of claim 5, further comprising:

non-conductive layers filling spaces between the first semiconductor chip and the uppermost one of the third semiconductor chips, between the third semiconductor chips, and between a lowermost one of the third semiconductor chips and the second semiconductor chip and enclosing the first connection terminals and the second connection terminals.

7. The semiconductor package of claim 1, wherein the first semiconductor chip further comprises first pads on the bottom surface of the first semiconductor chip, the second semiconductor chip further comprises second pads on the top surface of the second semiconductor chip, each of the third semiconductor chips further comprises third pads on a top surface thereof and fourth pads on a bottom surface thereof, the first pads are in direct contact with the third pads of an uppermost third semiconductor chip of the third semiconductor chips, each of the fourth pads are in direct contact with a third pad of the third pads of another third semiconductor chip of the third semiconductor chips adjacent thereto or in direct contact with the second pads of the second semiconductor chip.

8. The semiconductor package of claim 1, wherein an active surface of the first semiconductor chip faces the second semiconductor chip, and an active surface of each of the third semiconductor chips faces the first semiconductor chip.

9. The semiconductor package of claim 1, wherein the first semiconductor chip comprises third penetration vias that penetrate the first semiconductor chip and are exposed to an outside of the first semiconductor chip from a top surface of the first semiconductor chip.

10. The semiconductor package of claim 1, wherein a bottom surface of the mold layer is coplanar with the bottom surface of the chip stack.

11. The semiconductor package of claim 1, further comprising:

first pads between the chip stack and the outer terminals, wherein the first penetration vias are electrically connected to the outer terminals through the first pads.

12. The semiconductor package of claim 1, further comprising:

a redistribution layer between the chip stack and the outer terminals, wherein a top surface of the redistribution layer is in direct contact with the bottom surface of the second semiconductor chip and a bottom surface of the mold layer, and the outer terminals are electrically connected to the first penetration vias through the redistribution layer.

13. A semiconductor package, comprising:

a package substrate;

first semiconductor chips vertically stacked on each other;

a second semiconductor chip on a bottom surface of a lowermost first semiconductor chip of the first semiconductor chips and on a top surface of the package substrate;

a third semiconductor chip on a top surface of an uppermost first semiconductor chip of the first semiconductor chips; and a mold layer on a bottom surface of the third semiconductor chip and enclosing the first semiconductor chips and the second semiconductor chip, wherein each of the first semiconductor chips comprises:

upper pads on a top surfaces of each of the first semiconductor chips, a first connection terminal on a top surface of each of the upper pads, and lower pads on a bottom surfaces of each of the first semiconductor chips, wherein the second semiconductor chip comprises:

chip pads on a top surface of the second semiconductor chip, and second connection terminals on a top surface of each of the chip pads, and wherein each of the first semiconductor chips is electrically connected to another of the first semiconductor chips or the third semiconductor chip through the first connection terminals, the second semiconductor chip is electrically connected to the lowermost one of the first semiconductor chips through the second connection terminals, each of the first and second connection terminals comprises a solder ball or a solder bump, a bottom surface of the second semiconductor chip is coplanar with a bottom surface of the mold layer, the second semiconductor chip is a bottommost chip between the package substrate and the third semiconductor chip, the third semiconductor chip comprises a logic chip, a width of the third semiconductor chip is larger than a width of each of the first semiconductor chips and larger than a width of the second semiconductor chip, and a thickness of the third semiconductor chip ranges from 100 μm to 200 μm.

14. The semiconductor package of claim 13, wherein each of the first semiconductor chips comprises a memory chip, and the second semiconductor chip comprises a memory chip, which is of a same kind as each of the first semiconductor chips.

15. The semiconductor package of claim 13, wherein each of the first semiconductor chips further comprise first penetration vias penetrating therethrough, the second semiconductor chip further comprises second penetration vias and first pads, the second penetration vias penetrating the second semiconductor chip, the first pads being on the bottom surface of the second semiconductor chip, the first penetration vias are coupled to the lower pads, and the second penetration vias are coupled to the first pads.

16. The semiconductor package of claim 13, wherein an active surface of each of the first semiconductor chips faces the third semiconductor chip, and an active surface of the third semiconductor chip faces the second semiconductor chip.

17. The semiconductor package of claim 13, further comprising: non-conductive layers filling spaces between the second semiconductor chip and the lowermost first semiconductor chip of the first semiconductor chips, between the first semiconductor chips, and between the uppermost first semiconductor chip of the first semiconductor chips and the third semiconductor chip and enclosing the first connection terminals and the second connection terminals.

18. A semiconductor package, comprising:

a package substrate;

a first chip structure on a top surface of the package substrate;

a first semiconductor chip on the package substrate and horizontally spaced apart from the first chip structure; and a first mold layer on the package substrate and enclosing the first chip structure and the first semiconductor chip, wherein the first chip structure comprises:

a second semiconductor chip, a plurality of third semiconductor chips vertically stacked on the package substrate and being between the package substrate and the second semiconductor chip, each of the third semiconductor chips comprising penetration vias penetrating therethrough and exposed to an outside from a bottom surface thereof, first pads on a bottom surface of a lowermost third semiconductor chip of the third semiconductor chips and directly coupled to the penetration vias of the lowermost third semiconductor chip of the third semiconductor chips, and a second mold layer between the package substrate and the second semiconductor chip to enclose the third semiconductor chips, and wherein the second semiconductor chip comprises a logic chip, the lowermost third semiconductor chip of the third semiconductor chips is a bottommost chip between the package substrate and the second semiconductor chip, a width of the second semiconductor chip is larger than a width of each of the third semiconductor chips, a side surface of the second semiconductor chip is vertically aligned to a side surface of the second mold layer, an active surface of the second semiconductor chip faces the package substrate, and an active surface of an uppermost third semiconductor chip of the third semiconductor chips faces the second semiconductor chip.

19. The semiconductor package of claim 18, wherein a thickness of the second semiconductor chip ranges from 100 μm to 200 μm.

20. The semiconductor package of claim 19, further comprising:

an interposer on a top surface of the package substrate; and second chip structures on the package substrate, wherein each of the second chip structures has a same structure as the first chip structure, the first semiconductor chip, the first chip structure and the second chip structures are horizontally spaced apart from each other on the interposer, and the first semiconductor chip is electrically connected to the first and second chip structures using the interposer.

* * * * *